US012770704B2

(12) United States Patent
Kerstetter et al.

(10) Patent No.: US 12,770,704 B2
(45) Date of Patent: Oct. 20, 2026

(54) RECYCLED FINE GRANULARITY COUNTER-BASED RAS CHAIN

(71) Applicant: Micron Technology, Inc., Boise, ID (US)

(72) Inventors: Bryan David Kerstetter, Kuna, ID (US); Ryan Archer Caraway, Boise, ID (US)

(73) Assignee: Micron Technology, Inc., Boise, ID (US)

(*) Notice: Subject to any disclaimer, the term of this patent is extended or adjusted under 35 U.S.C. 154(b) by 161 days.

(21) Appl. No.: 18/974,065

(22) Filed: Dec. 9, 2024

(65) Prior Publication Data

US 2025/0336462 A1 Oct. 30, 2025

Related U.S. Application Data

(60) Provisional application No. 63/640,704, filed on Apr. 30, 2024.

(51) Int. Cl.

*G11C 29/12* (2006.01)
*G11C 29/14* (2006.01)
*G11C 29/36* (2006.01)

(52) U.S. Cl.

CPC ........ *G11C 29/12015* (2013.01); *G11C 29/14* (2013.01); *G11C 29/36* (2013.01); *G11C 2029/3602* (2013.01)

(58) Field of Classification Search

CPC ........ G11C 29/12015
USPC ........ 365/201
See application file for complete search history.

(56) References Cited

U.S. PATENT DOCUMENTS

2005/0022081 A1* 1/2005 Syed .................. G01R 31/3191 714/724
2020/0076416 A1* 3/2020 Bang ................ H03K 17/08122
2021/0304806 A1* 9/2021 Wong .................. G11C 11/2255

* cited by examiner

*Primary Examiner* — Anthan Tran
(74) *Attorney, Agent, or Firm* — Fletcher Yoder, P.C.

(57) ABSTRACT

Systems and methods are provided for generating timing control signals for controlling the access to the memory cells of a memory device. The memory device employs a counter-based RAS chain circuit including multiple Match and Delay blocks to generate timing control signals with fine timing granularities. The Match and Delay blocks include circuits to enable area savings and improve area efficiency (AE) in the memory device as well as improve the flexibility for development chips and production parts.

20 Claims, 8 Drawing Sheets

RECYCLED FINE GRANULARITY COUNTER-BASED RAS CHAIN

CROSS-REFERENCE TO RELATED APPLICATIONS

This application claims priority to U.S. Provisional Application No. 63/640,704, filed Apr. 30, 2024, which is incorporated by reference herein in its entirety.

BACKGROUND OF THE INVENTION

Field of the Invention

The present invention relates generally to the field of memory devices. More specifically, embodiments of the present disclosure relate to timing control circuits in memory devices.

Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Memory devices are widely used to store information related to various electronic devices such as computers, wireless communication devices, cameras, digital displays, and the like. Memory devices are frequently provided as internal memory, integrated circuits and/or external removable devices in computers or other electronic devices. There are many different types of memory, including volatile and non-volatile memory. Volatile memory, including random access memory (RAM), static random access memory (SRAM), dynamic random access memory (DRAM), and synchronous dynamic random access memory (SDRAM), among others, may require a source of applied power to maintain its data. Non-volatile memory, by contrast, may retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others.

A memory device may include a number of storage elements, such as memory cells. Memory cells of a binary memory device may, for example, include a charged or discharged capacitor. A charged capacitor of a memory cell may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous. Some of the memory devices include memory cells that may be accessed by turning on a transistor that couples the memory cell (e.g., the capacitor) with a wordline or a bitline/digit line. Different memory devices may use different architectures for arranging the memory cells. For example, different memory devices may arrange the memory cells in 2-dimensional or 3-dimensional rows and columns. A memory cell may be accessed (e.g., by using access commands such as read/write) based on activating a row and a column of the memory device corresponding to the memory cell. Sense amplifiers (SAs) may be used by a memory device during read operations. Specifically, the read circuitry of the memory device utilizes the sense amplifiers to receive low voltage (e.g., low differential) signals and amplify the small voltage differences to enable the memory device to interpret the data properly. A sense amplifier may include multiple devices (e.g., an isolation gate, a PMOS sense amplifier (PSA), an NMOS sense amplifier (NSA)) formed on an integrated circuit (IC) chip.

Timing control circuits may be used to provide timing signals for controlling the access to the memory cells. For example, a memory device may employ a row address strobe (RAS) chain circuit to generate timing control signals, such as word line (WL) activation timing, sense amplifier (SA) activation timing, precharge timings, etc. Traditionally, delay-based RAS chains are used to provide timing control signals. However, it may be hard to adjust the trim range in a delay-based RAS chain. For example, adjusting the trim range in a delay-based RAS chain may involve adding or removing delay elements, which may affect the area efficiency (AE). In addition, it is difficult to reorder signals in the delay-based RAS chain. Alternatively, a counter-based RAS chain may be used to provide timing control signals. The counter-based RAS chain may have the ability to program event timings and reorder events. However, timing granularity of the current counter-based RAS chain is limited due to various factors, such as the timing granularity of the oscillator used to provide oscillating signal for the counter-based RAS chain, time delay caused by the Gray code counter in the counter-based RAS chain, etc. Accordingly, it is desirable to have a counter-based RAS chain having fine timing granularity and improved area efficiency (AE).

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

A memory device may perform memory operations such as storing data (e.g., write operations) and retrieving stored data (e.g., read operations). For example, a computing system may include various system components including one or multiple memory devices. The system components may communicate data (e.g., data bits) to perform system operations. For example, the system may include one or more processing components, one or more memory devices, among other system components. In different embodiments, the computing system may be disposed on a single electronic chip or multiple electronic chips. Moreover, the computing system may be disposed on a single electronic device or multiple electronic devices positioned in proximity of or remote from each other.

The memory device may include a number of memory banks, controller circuitry, command decoder circuitry, and a clock circuit to provide the clock signal, among other memory components. In some cases, the controller circuitry (hereinafter, controller) may include the command decoder circuitry (hereinafter, command decoder). In alternative or additional cases, the command decoder may include separate circuitry disposed between the controller and the memory banks or any other viable location. The memory device may include control blocks associated with the memory banks. In some cases, the command decoder may provide the access instructions to the control blocks of the memory banks. The memory banks and/or the control blocks of the memory banks may include sense amplifiers (SAs) used for read operations of the memory device.

The current disclosure herein provides a technology and methods related to generating timing control signals for controlling the access to the memory cells of a memory device. The memory device may employ a counter-based RAS chain circuit including multiple Match and Delay blocks to generate timing control signals with fine timing granularities. The Match and Delay blocks may include circuits to enable area savings and improve area efficiency (AE) in the memory device, as well as improve the flexibility for development chips and production parts.

Figure 1:
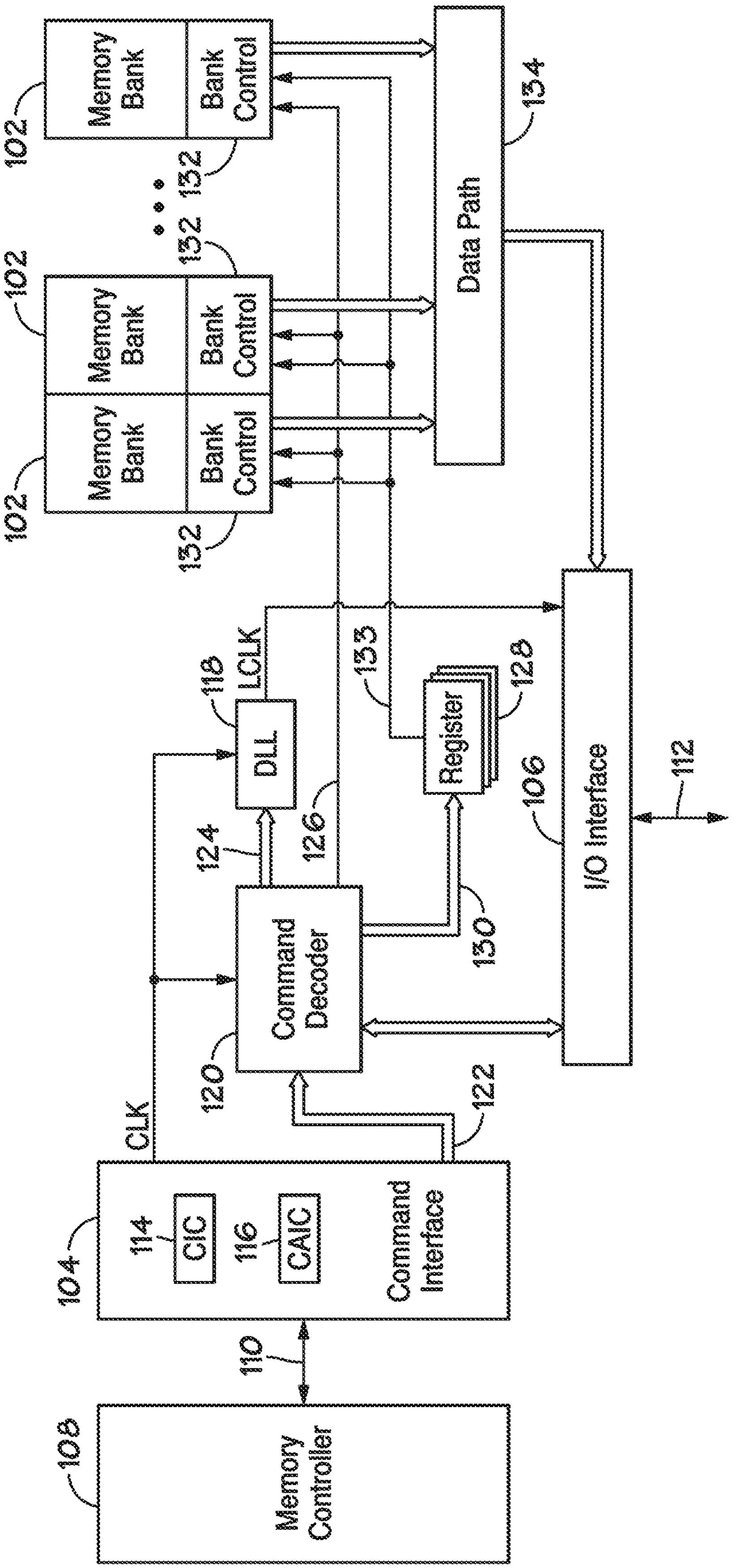
FIG. 1 is a block diagram illustrating certain features of a memory device, according to an embodiment of the present disclosure.

Turning now to the figures, FIG. 1 depicts a simplified block diagram illustrating certain features of a memory device 100 (e.g., a memory subsystem of an apparatus). Specifically, the block diagram of FIG. 1 depicts a functional block diagram illustrating certain functionality of the memory device 100. In accordance with one embodiment, the memory device 100 may include a random access memory (RAM) device, a ferroelectric RAM (FeRAM) device, a dynamic RAM (DRAM) device, a static RAM (SRAM) device (including a double data rate SRAM device), flash memory, and/or a 3D memory array including phase change (PC) memory and/or other chalcogenide-based memory, such as self-selecting memories (SSM). Moreover, each memory cell of such 3D memory array may include a corresponding logic storing device (e.g., a capacitor, a resistor, or the resistance of the chalcogenide material(s)).

The memory device 100 may include a number of memory banks 102 each including one or more memory arrays. Various configurations, organizations, and sizes of the memory banks 102 on the memory device 100 may be used based on an application and/or design of the memory device 100 within an electrical system. For example, in different embodiments, the memory banks 102 may include a different number of rows and/or columns of memory cells. Moreover, the memory banks 102 may each include a number of pins for communicating with other blocks of the memory device 100. For example, each memory bank 102 may receive one data bit per pin at each clock cycle. Furthermore, the memory banks 102 may be grouped into multiple memory groups (e.g., two memory groups, three memory groups).

The memory device 100 may also include a command interface 104 and an input/output (I/O) interface 106. The command interface 104 is configured to provide a number of signals received from a processor (e.g., a processor subsystem of an apparatus) or a controller, such as a memory controller 108. In different embodiments, the memory controller 108, hereinafter controller 108, may include one or more processors (e.g., memory processors), one or more programmable logic fabrics, or any other suitable processing components.

In some embodiments, a bus 110 may provide a signal path or a group of signal paths to allow bidirectional communication between the controller 108, the command interface 104 and the I/O interface 106. For example, the controller 108 may receive memory access requests from the I/O interface via the command interface 104 and the bus 110. Moreover, the controller 108 may provide the access commands and/or access instructions for performing memory operations to the command interface 104 via the bus 110.

Similarly, an external bus 112 may provide another signal path or group of signal paths to allow for bidirectional transmission of signals, such as data signals and access commands (e.g., read/write requests), between the I/O interface 106, the controller 108, a command decoder 120, and/or other components. Thus, the controller 108 may provide various signals (e.g., the access commands, the access instructions, or other signals) to different components of the memory device 100 to facilitate the transmission and receipt of data to be written to or read from the memory banks 102.

That said, the command interface 104 may receive different signals from the controller 108. For example, a reset command may be used to reset the command interface 104, status registers, state machines and the like, during power-up. Various testing signals may also be provided to the memory device 100. For example, the controller 108 may use such testing signals to test connectivity of different components of the memory device 100. In some embodiments, the command interface 104 may also provide an alert signal to the controller 108 upon detection of an error in the memory device 100. Moreover, the I/O interface 106 may additionally or alternatively be used for providing such alert signals, for example, to other system components electrically connected to the memory device 100.

The command interface 104 may also receive one or more clock signals from an external device (e.g., an external clock signal). Moreover, the command interface 104 may include a clock input circuit 114 (CIC) and a command address input circuit 116 (CAIC). The command interface 104 may use the clock input circuit 114 and the command address input circuit 116 to receive the input signals, including the access commands, to facilitate communication with the memory banks 102 and other components of the memory device 100.

Moreover, the clock input circuit 114 may receive the one or more clock signals (e.g., the external clock signal) and may generate an internal clock signal (CLK) therefrom. In some embodiments, the command interface 104 may provide the CLK to the command decoder 120 and an internal clock generator, such as a delay locked loop (DLL) 118 circuit. The DLL 118 may generate a phase controlled internal clock signal (LCLK) based on the received CLK. For example, the DLL 118 may provide the LCLK to the I/O interface 106. Subsequently, the I/O interface 106 may use the received LCLK as a clock signal for transmitting the read data using the external bus 112.

The command interface 104 may also provide the internal clock signal CLK to various other memory components. As mentioned above, the command decoder 120 may receive the internal clock signal CLK. In some cases, the command decoder 120 may also receive the access commands via a bus 122 and/or through the I/O interface 106 received via the external bus 112. For example, the command decoder 120 may receive the access commands through the I/O interface 106 transmitted by one or more external devices. In some cases, a processor may transmit the access commands.

The command decoder 120 may decode the access commands and/or the memory access requests to provide corresponding access instructions for accessing target memory cells. For instance, the command decoder 120 may provide the access instructions to one or more control blocks 132 associated with the memory banks 102 via a bus path 126. In some cases, the command decoder 120 may provide the access instructions to the control blocks 132 in coordination with the DLL 118 over a bus 124. For example, the command decoder 120 may coordinate generation of the access instructions in-line (e.g., synchronized) with the CLK and/or LCLK. In some cases, the command decoder 120 may receive the access commands using a rising edge and/or a falling edge of the external clock signal. For example, a processor may transmit the access commands using a memory command protocol, such as a single clock cycle memory command protocol, or a multi-clock cycle memory command protocol. The processor may use a specific memory command protocol based at least in part on the number of pins of the memory device 100 or the I/O interface 106, the number of rows and/or columns of the memory banks 102, and the number of memory banks 102. Subsequently, the command decoder 120 may provide the access instructions to the memory banks 102 based on receiving and decoding the access commands.

Accordingly, the command decoder 120 may provide the access instructions to the memory banks 102 using one or multiple clock cycles of the CLK via the bus path 126. The command decoder 120 may also transmit various signals to one or more registers 128 via, for example, one or more global wiring lines 130. Moreover, the memory device 100 may include other decoders, such as row decoders and column decoders, to facilitate access to the memory banks 102, as discussed below.

In some embodiments, each memory bank 102 may include a respective control block 132. In some cases, each of the control blocks 132 may also provide row decoding and column decoding capability based on receiving the access instructions. Accordingly, the control block 132 may facilitate accessing the memory cells of the respective memory banks 102. For example, the control blocks 132 may include circuitry (e.g., logic circuitry) to facilitate accessing the memory cells of the respective memory banks 102 based on receiving the access instructions. For example, each memory bank 102 and/or corresponding control block 132 may include sense amplifiers for read operations of the memory cells of respective memory bank 102.

In some cases, the control blocks 132 may receive the access instructions and determine target memory banks 102 associated with the target memory cells. In specific cases, the command decoder 120 may include the control blocks 132. Moreover, the control blocks 132 may also provide timing control and data control functions to facilitate execution of different commands with respect to the respective memory banks 102.

Furthermore, the command decoder 120 may provide register commands to the one or more registers 128 to facilitate operations of one or more of the memory banks 102, the control blocks 132, and the like. For example, one of the one or more registers 128 may provide instructions to configure various modes of programmable operations and/or configurations of the memory device 100. The one or more registers 128 may be included in various memory devices to provide and/or define operations of various components of the memory device 100. The one or more registers 128 may communicate with the control blocks 132 via a bus path 133

In some embodiments, the one or more registers 128 may provide configuration information to define operations of the memory device 100. For example, the one or more registers 128 may include operation instructions for DRAMs, synchronous DRAMs, FeRAMs, chalcogenide memories (e.g., SSM memory, PC memory), or other types of memories. As discussed above, the one or more registers 128 may receive various signals from the command decoder 120, or other components, via the one or more global wiring lines 130.

In some embodiments, the one or more global wiring lines 130 may include a common data path, a common address path, a common write command path, and a common read command path. The one or more global wiring lines 130 may traverse across the memory device 100, such that each of the one or more registers 128 may couple to the global wiring lines 130. The additional registers may involve additional wiring across the memory device (e.g., die), such that the registers are communicatively coupled to the corresponding memory components.

The I/O interface 106 may include a number of pins (e.g., 7 pins) to facilitate data communication with external components (e.g., the processing component, such as a processor). Particularly, the I/O interface 106 may receive the access commands via the pins. Moreover, data stored on the memory cells of the memory banks 102 may be transmitted to and/or retrieved from the memory banks 102 over a data path 134. The data path 134 may include a plurality of bi-directional data buses to one or more external devices via the I/O interface 106. For certain memory devices, such as a DDR5 SDRAM memory device, the I/O signals may be divided into upper and lower bytes; however, such segmentation is not utilized in conjunction with other memory device types.

That said, in different embodiments, the memory device 100 may include additional or alternative components. That is, the memory device 100 may include additional or alternative components such as power supply circuits (for receiving external VDD and VSS signals), read/write amplifiers (to amplify signals during read/write operations), temperature sensors (for sensing temperatures of the memory device 100), etc. Accordingly, it should be understood that the block diagram of FIG. 1 is only provided to highlight certain functional features of the memory device 100 to aid in the subsequent detailed description.

Figure 2:
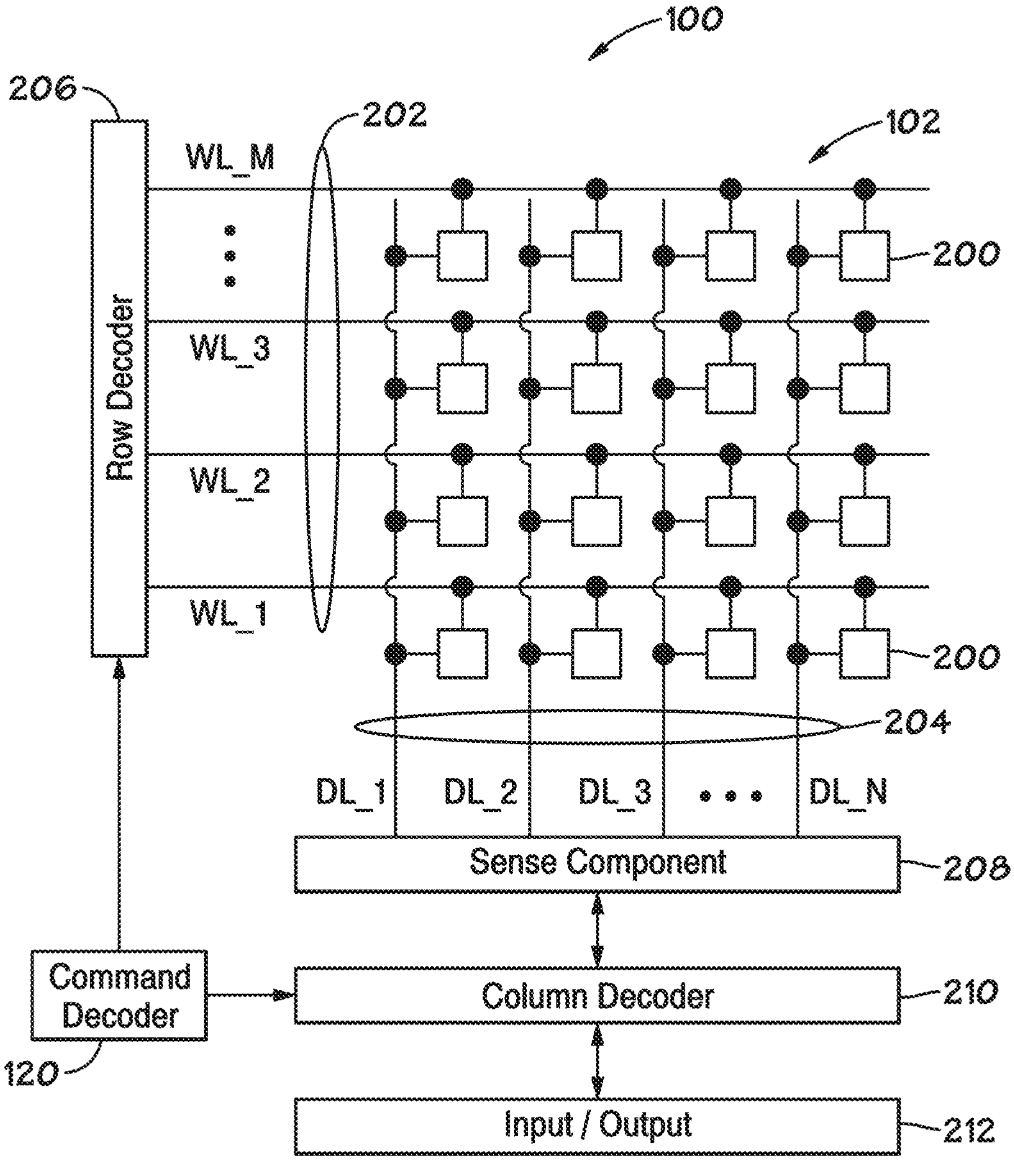
FIG. 2 illustrates a memory bank of the memory device of FIG. 1, according to an embodiment of the present disclosure.

Referring now to FIG. 2, a memory bank 102 of the memory device 100 is illustrated in accordance with various examples of the present disclosure. The memory bank 102 may include a number of memory cells 200 that are programmable to store different memory states. In the depicted embodiment, the memory cells 200 may be arranged in multiple rows (e.g., 22 rows, 19 rows, etc.) and multiple columns.

Memory operations, such as reading and writing memory states, may be performed on the memory cells 200 by activating or selecting the appropriate word lines 202 and digit lines 204. Activating or selecting a word line 202 or a digit line 204 may include applying a voltage to the respective lines. The word lines 202 and the digit lines 204 may include conductive materials.

For example, word lines 202 and digit lines 204 may be made of metals (such as copper, aluminum, gold, tungsten, etc.), metal alloys, other conductive materials, or the like. In the depicted embodiment, each row of the memory cells 200 is connected to a single word line 202, and each column of the memory cells 200 is connected to a single digit line 204. Moreover, each of the memory cells 200 may be associated with a row and a column of the memory bank 102. Accordingly, each of the memory cells 200 is connected to a respective word line 202 and a respective digit line 204.

By applying a voltage to a single word line 202 and a single digit line 204, a single memory cell 200 may be activated (or accessed) at their intersection. Accessing the memory cell 200 may include performing reading or writing operation on the memory cell 200. For example, a read operation may include sensing a charge level from the memory cell 200. The intersection of a word line 202 and digit line 204 may be referred to as an address of a respective memory cell 200. Accordingly, the command decoder 120 may provide the access instructions, including the address bits, to indicate the word lines 202 and digit lines 204 corresponding to the target memory cells 200.

In some architectures, the memory state storage of the memory cell 200 (e.g., a capacitor) may be electrically isolated from the digit line by a selection component. The word line 202 may be connected to and may control the selection component. For example, the selection component may be a transistor and the word line 202 may be connected to the gate of the transistor. Activating the word line 202 may result in an electrical connection or closed circuit between the capacitor of the memory cell 200 and its corresponding digit line 204. The digit line 204 may then be activated to either read or write the memory cell 200.

Accordingly, accessing the memory cell 200 may be controlled through a respective row decoder 206 and a respective column decoder 210. As mentioned above, in different embodiments, the controller 108, the command decoder 120, and/or the control blocks 132 may include the row decoder 206 and/or the column decoder 210. In some examples, the row decoder 206 may receive a row address from the command decoder 120 and may activate the appropriate word line 202 based on the received row address.

Similarly, a column decoder 210 may receive a column address from the command decoder 120 and may activate the appropriate digit line 204. The command decoder 120 may provide the row address and the column address based on receiving and decoding the access commands and providing the access instructions. For example, the memory bank 102 may include multiple word lines 202, labeled WL_1 through WL_M, and multiple digit lines 204, labeled DL_1 through DL_N, where M and N depend on the array size. Thus, by activating a word line 202 and a digit line 204, e.g., WL_2 and DL_3, the memory cell 200 at their intersection may be accessed.

In any case, upon accessing, the memory cell 200 may be read, or sensed, by a sense component 208 (e.g., includes one or more sense amplifiers) to determine the stored state of the memory cell 200. For example, after accessing the memory cell 200, a ferroelectric capacitor of the memory cell 200 may discharge a first charge (e.g., a dielectric charge) onto its corresponding digit line 204. In other examples, after accessing the memory cell 200, the ferroelectric capacitor of the memory cell 200 may discharge a second or third charge (e.g., a polarization charge) onto its corresponding digit line 204. Discharging the ferroelectric capacitor may be based on biasing, or applying a voltage, to the ferroelectric capacitor.

The discharging may induce a change in the voltage of the digit line 204, which sense component 208 may compare to a reference voltage (not shown) in order to determine the stored state of the memory cell 200. For example, if the digit line 204 has a higher voltage than the reference voltage, then sense component 208 may determine that the stored state in the memory cell 200 is related to a first predefined memory state. In some cases, the first memory state may include a state 1, or may be another value—including other logic values associated with multi-level sensing that enables storing more than two values (e.g., 3 states per cell or 1.5 bits per cell). The sense component 208 may include various transistors or amplifiers in order to detect and amplify a difference in the signals, which may be referred to as latching. The detected logic state of the memory cell 200 may then be output through column decoder 210 as output 212.

In some examples, detecting and amplifying a difference in the signals may include latching a charge that is sensed in sense component 208. One example of this charge may include latching a dielectric charge associated with the memory cell 200. As an example, the sense component 208 may sense a dielectric charge associated with the memory cell 200. The sensed dielectric charge may be latched in a latch within the sense component 208 or a separate latch that is in electronic communication with the sense component 208.

Figure 3:
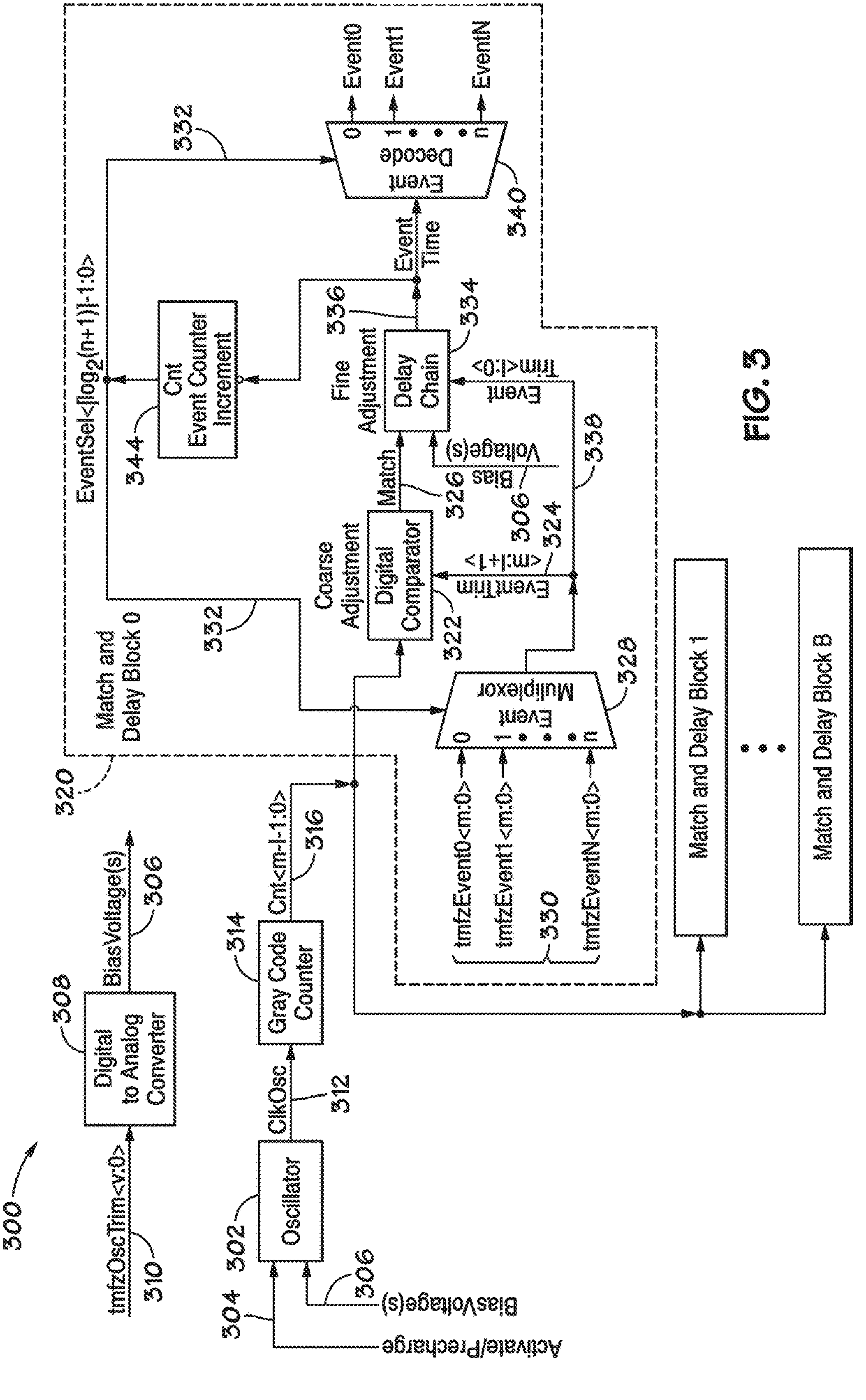
FIG. 3 is a circuit diagram of an embodiment of a counter-based RAS chain that may be used to generate timing control signals for the memory device of FIG. 1, according to an embodiment of the present disclosure.

FIG. 3 is a circuit diagram of an embodiment of a counter-based RAS chain 300 that may be used to generate timing control signals for the memory device 100. The counter-based RAS chain 300 may include an oscillator 302, which may be enabled by receiving an access command (e.g., Activate/Precharge) 304. The oscillator may be trimmable by using one or more bias voltages (BiasVoltage(s)) 306, which may be generated by using a digital to analog converter 308 based on a trim signal 310. The oscillator 302 may generate a clock oscillating signal (ClkOsc) 312, which may be used to increment a Gray code counter 314 (e.g., every half period $$\left(\frac{CLK\ \text{period}}{2}\right)$$

of the signal ClkOsc 312 increment 1 count). In some embodiments, the Gray code counter 314 may be incremented on both the rising edge and the falling edge of the signal ClkOsc 312. An output 316 including a count value of the Gray code counter 314 may be transmitted into one or more Match and Delay blocks, such as Match and Delay block 0, Match and Delay block 1 . . . Match and Delay block B (B=0, 1, 2 . . . ). In some embodiments, the Match and Delay blocks may include similar circuits. In some embodiments, the Match and Delay blocks may include different circuits.

Figure 4:
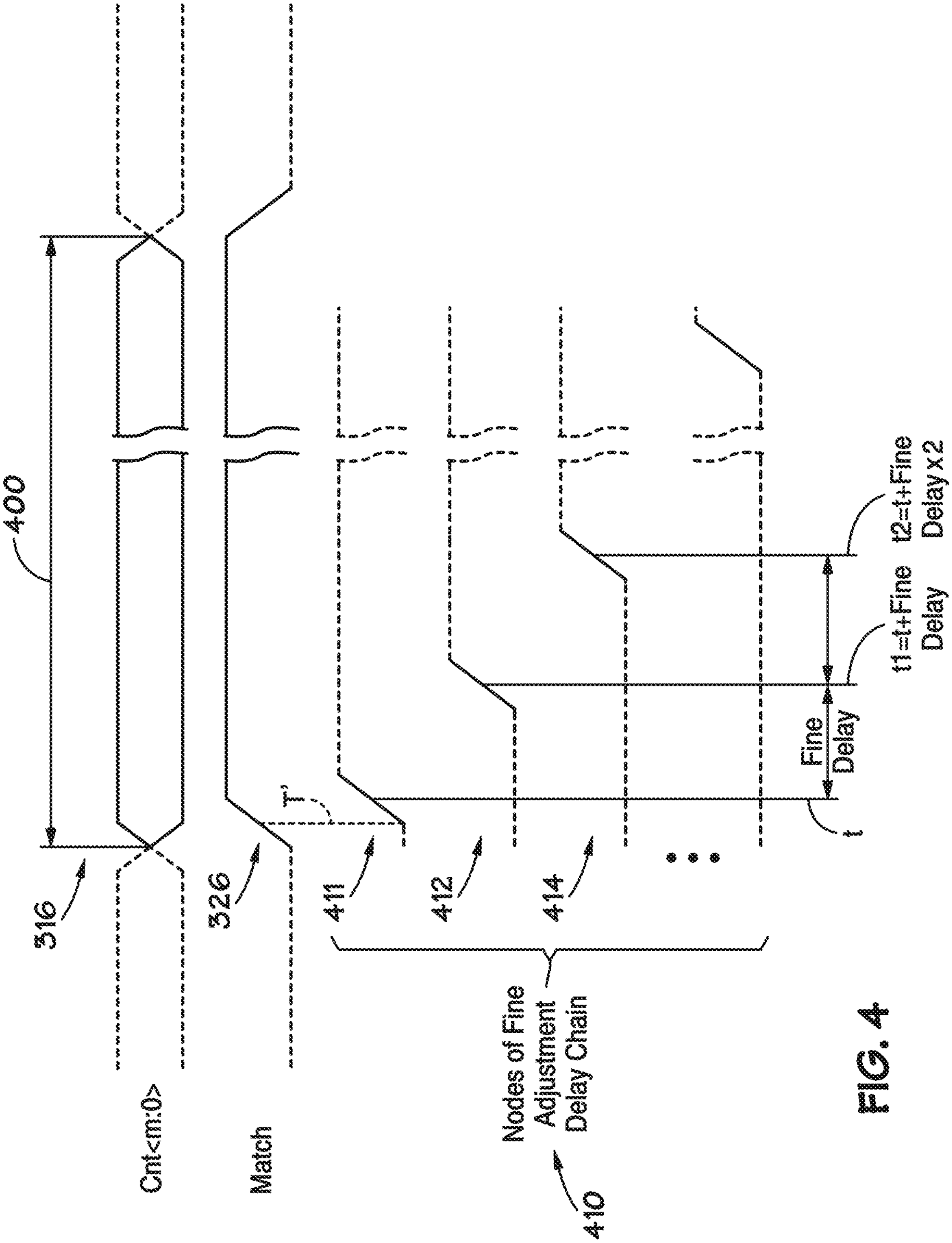
FIG. 4 is a timing diagram illustrating a coarse adjustment of delay and a fine adjustment of delay, according to an embodiment of the present disclosure.

FIG. 3 illustrates an embodiment of the Match and Delay block 0 including a circuit 320. The circuit 320 may include a digital comparator 322 to receive the output 316 from the Gray code counter 314. The digital comparator 322 may compare the count value included in the output 316 with a coarse event value 324, and output a match signal 326 when the count value of the output 316 matches (e.g., equal to) the coarse event value 324. The coarse event value 324 may be generated by a selection device 328 (e.g., a multiplexer). The selection device 328 may select an event setting from a group 330 of (n+1) event settings (n=1, 2 . . . ) based on an event select signal 332 (e.g., EventSel<⌈$\log_2$(n+1)⌉−1:0>). For example, the event settings in the group 330 may be programmed by (n+1) sets of testmode fuses (e.g., tmfzEventN<m:0>, N=0, 1, 2 . . . n), and each event setting may have (m+1) (m=0, 1, 2 . . . ) testmode fuse terms. The upper testmode fuse terms (e.g., EventTrim<m:1+1>, 1=0, 1, 2 . . . m−1) of the event setting may be used to generate the coarse event value 324 to indicate the count value of the Gray code counter 314 (e.g., Cnt<m−1−1:0>) for generating the match signal 326, as illustrated in FIG. 4. That is, the digital comparator 322 may utilize the upper testmode fuse terms of an event setting to provide a coarse adjustment for the delay of the event and generate the match signal 326.

Figure 5:
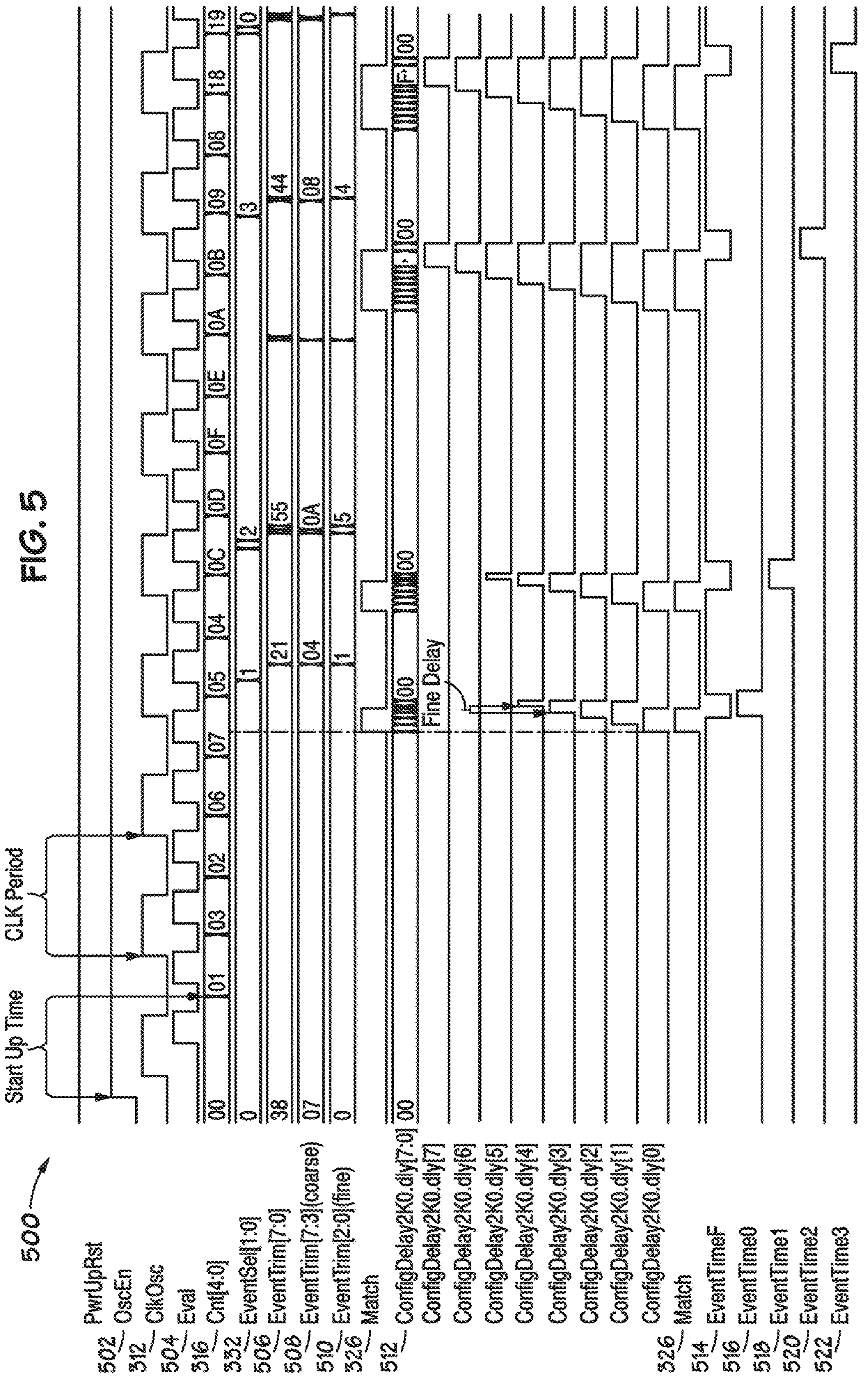
FIG. 5 is a timing diagram illustrating example timing of signals used in FIG. 3 and FIG. 4, according to an embodiment of the present disclosure.

The match signal 326 may be input into a configurable delay chain 334, which may include one or more delay elements for providing a fine adjustment for the delay of the event, and the adjusted match signal 326 may be used to generate an event time pulse 336. The fine adjustment provided by the configurable delay chain 334 may be trimmable by using the one or more bias voltages 306, which may allow the oscillator 302 and the configurable delay chain 334 to track one another. For example, the one or more bias voltages 306 may be used to starve current from delay elements in the oscillator 302 and the configurable delay chain 334. The lower testmode fuse terms (e.g., EventTrim<1:0>, 1=0, 1, 2 . . . m−1) may be used to generate a fine event value 338 to indicate the value of the fine adjustment that may be used to adjust (e.g., delay) the match signal 326 to obtain the event time pulse 336, as illustrated in FIG. 4. The event time pulse 336 may be input into a decode circuit 340 (e.g., a demultiplexer). The decode circuit 340 may associate (e.g., via mapping) the event time pulse 336 with corresponding event (e.g., eventN, N=0, 1, 2 . . . n) based on the event select signal 332 generated by an event counter 344. The event time pulse 336 may be used to set timing control signals for controlling the access to the memory cells of the memory device 100, as illustrated in FIG. 5. The event time pulse 336 (e.g., the falling edge of the event time pulse 336) may be used to increment the event counter 344, which may generate the event select signal 332 (e.g., EventSel<⌈$\log_2$(n+1)⌉−1:0>).

FIG. 4 is a timing diagram showing a coarse adjustment of delay provided by the Gray code counter 314 and a fine adjustment of delay provided by a set of nodes 410 of the configurable delay chain 334. As illustrated in FIG. 4, the count value included in the output 316 of the Gray code counter 314 (e.g., Cnt<m:0>) may indicate the coarse adjustment time period of the delay for the event. For instance, every increment of the Gray code counter 314 corresponds to a fixed time period (e.g., every half period $$\left(\frac{CLK\ \text{period}}{2}\right)$$

of the ClkOsc), accordingly, the count value of the Gray code counter 314 (e.g., Cnt<m:0>), which matches the coarse event value 324, corresponds to a coarse adjustment time period. Accordingly, the match signal 326 may be generated during a period 400 when the count value of the Gray code counter 314 (e.g., Cnt<m:0>) matches (e.g., equal to) the coarse event value 324. As mentioned above, the fine event value 338 (e.g., EventTrim<1:0>, 1=0, 1, 2 . . . m−1) may indicate the value of the fine adjustment of the configurable delay chain 334 that may be used to adjust the match signal 326 to obtain the event time pulse 336. For example, a first node 411 of the configurable delay chain 334 may provide no delay (e.g., the node ConfigDelay2K0.dly[0] illustrated in FIG. 5), which means that all fine adjustment delay elements in the configurable delay chain 334 may be bypassed. In the embodiment illustrated in FIG. 4, a slight delay is shown between the output 316 and the match signal 326, which may be due to delay through the digital comparator 322. In the embodiment illustrated in FIG. 4, a slight delay is shown between the rising edge T' of the match signal 326 and the rising edge t of the event time pulse 336 in the node 411, which may be due to the logic required for performing the selection of the nodes. A second node 412 of the configurable delay chain 334 may provide a fine delay from time t to time t1 (t1=t+fine delay), and a second node 414 may provide a fine delay for delaying from time t1 to time t2 (t2=t+fine delay*2), and so on. Accordingly, the event time pulse 336 may have a relationship with the coarse event value 324 and the fine event value 338, as described in Equation [1]:

$$\text{Event time} = \text{Start Up Time} + \frac{CLK\ \text{period}}{2} \times \text{coarse event value} + \text{fine delay} \times \text{fine event value} - \text{Propagation Delay}, \quad [1]$$

where the propagation delay represents the delay caused by the signal propagating in the counter-based RAS chain 300.

FIG. 5 is a timing diagram 500 depicting example timing of signals (e.g., when m=7, 1=2, n=3) that may be used in the embodiment illustrated in FIG. 3 and FIG. 4. In the illustrated embodiment in FIG. 5, an enable signal 502 (e.g., the access command 304) may be used to enable the oscillator 302, which may generate the signal ClkOsc 312. In the illustrated embodiment in FIG. 5, a dynamic match circuit (e.g., for precharge and evaluate) may be used for the digital comparator 322 to provide further area savings, and a signal 504 may be used to increment the Gray code counter 314. The dynamic match signal may provide area savings. The signal 504 may have a period equal to a half period $$\left(\frac{CLK \text{ period}}{2}\right)$$

of the signal ClkOsc 312. The output 316 of the Gray code counter 314 may include a count value (e.g., Cnt[4:0], with m=7, 1=2). The event select signal 332 (e.g., EventSel[1:0]) may be used to select an event setting from the event settings of the four events (e.g., Event0, Event1, Event2, Event3) in the group 330. The event settings may be programmed by 4 sets of testmode fuses, and each event setting may have 8 testmode fuse terms 506 (e.g., EventTrim[7:0]). The upper testmode fuse terms 508 (e.g., EventTrim[7:3]) may be used to generate the coarse event value 324 indicating the count value of the Gray code counter 314 (e.g., Cnt[4:0]), and the lower testmode fuse terms 510 (e.g., EventTrim[2:0]) may be used to generate the fine event value 338. When the count value included in the output 316 matches (e.g., equal to) the coarse event value 324 (e.g., when Cnt[4:0]=7 for the first event corresponding to EventSel[1:0]=0, as indicated in FIG. 5), a pulse may be generated in the match signal 326, as illustrated in FIG. 5. For example, when the signal 504 is at low (e.g., "0"), the output node of the digital comparator 322 may be precharged to a certain state (e.g., the match signal 326 is at low state (e.g., "0"). When the signal 504 is at high state (e.g., "1") and the count value of the Gray code counter 314 does not equal to the coarse event value 324, the output node of the digital comparator 322 may remain floating at the precharged state (e.g., the match signal 326 remains at low state (e.g., "0"). When the signal 504 is at high state (e.g., "1") and the count value of the Gray code counter 314 does equal to the coarse event value 324, the output node of the digital comparator 322 may be brought to an opposite state of the precharged state (e.g., the match signal 326 changes to high state (e.g., "1"). In the above example when Cnt[4:0]=7, when the count value Cnt[4:0] equals to the coarse event value 324 (EventTrim[7:3]=7), the match signal 326 is at high state when the signal 504 is at high state, which generates a pulse of the match signal 326, as illustrated in FIG. 5.

In the illustrated embodiment in FIG. 5, the configurable delay chain 334 may include a set 512 of 8 nodes (e.g., ConfigDelay2K0.dly[7:0]), and each node (e.g., ConfigDelay2K0.dly[k], k=0, 1, 2 . . . 7) may provide a fine delay. For example, the node ConfigDelay2K0.dly[0] may be a node with no delay being added to the match signal 326, and the node ConfigDelay2K0.dly[1] may be a node with one fine delay added to the node ConfigDelay2K0.dly[0], and, therefore, one fine delay added to the match signal 326. The node ConfigDelay2K0.dly[2] may be a node with one fine delay added to the node ConfigDelay2K0.dly[1], and, therefore, two fine delays added to the match signal 326. Similarly, the node ConfigDelay2K0.dly[7] may be a node with one fine delay added to the node ConfigDelay2K0.dly [6], and, therefore, seven fine delays added to the match signal 326. Since the fine event value 338 may indicate the value of the fine adjustment that may be used to adjust (e.g., delay) the match signal 326 to obtain the event time pulse 336, as described in Equation [1], the fine event value 338 may indicate the node of the configurable delay chain 334 that may be used to provide the fine adjustment to obtain the event time pulse 336. In FIG. 5, a signal 514 (e.g., EventTimeF) indicates an inverse signal of the event time pulse 336, a signal 516 illustrates the event time pulse (e.g., EventTime0) for Event0, a signal 518 illustrates the event time pulse (e.g., EventTime1) for Event1, a signal 520 illustrates the event time pulse (e.g., EventTime2) for Event2, and a signal 522 illustrates the event time pulse (e.g., EventTime3) for Event3. The event time pulses may be used to set timing control signals for controlling the access to the memory cells of the memory device 100 (e.g., set latches of sense amplifier (SA) control signals high or low). The event time pulses may be used to set a rising/falling edge of a timing control signal. For example, the signal 516 (e.g., EventTime0) may be associated with SA control signal A rising edge, the signal 518 (e.g., EventTime1) may be associated with SA control signal B rising edge, the signal 520 (e.g., EventTime2) may be associated with SA control signal C rising edge, and the signal 522 (e.g., EventTime3) may be associated with SA control signal B falling edge.

It should be noted that, in the illustrated embodiment in FIG. 5, some values (e.g., Cnt[4:0], EventTrim[7:3], etc.), which are related to the count value of the Gray code counter 314, are binary values of the Gray codes. Table 1 describes relationships among decimal values, binary codes, and the Gray codes.

TABLE 1

| Decimal | Binary | Gray |
|---|---|---|
| 0 | 00000 | 00000 |
| 1 | 00001 | 00001 |
| 2 | 00010 | 00011 |
| 3 | 00011 | 00010 |
| 4 | 00100 | 00110 |
| 5 | 00101 | 00111 |
| 6 | 00110 | 00101 |
| 7 | 00111 | 00100 |
| 8 | 01000 | 01100 |
| 9 | 01001 | 01101 |
| 10 | 01010 | 01111 |

For example, when Cnt[4:0] has a value of 7, it corresponds to Gray code "00111", which corresponds to binary code "00101" and decimal value of 5, indicating the 5$^{th}$ pulse in the signal 504, as illustrated in FIG. 5. In some embodiments, binary codes may be used for some values illustrated in FIG. 5 (e.g., Cnt[4:0], EventTrim[7:3], EventTrim[2:0], etc.).

Figure 6:
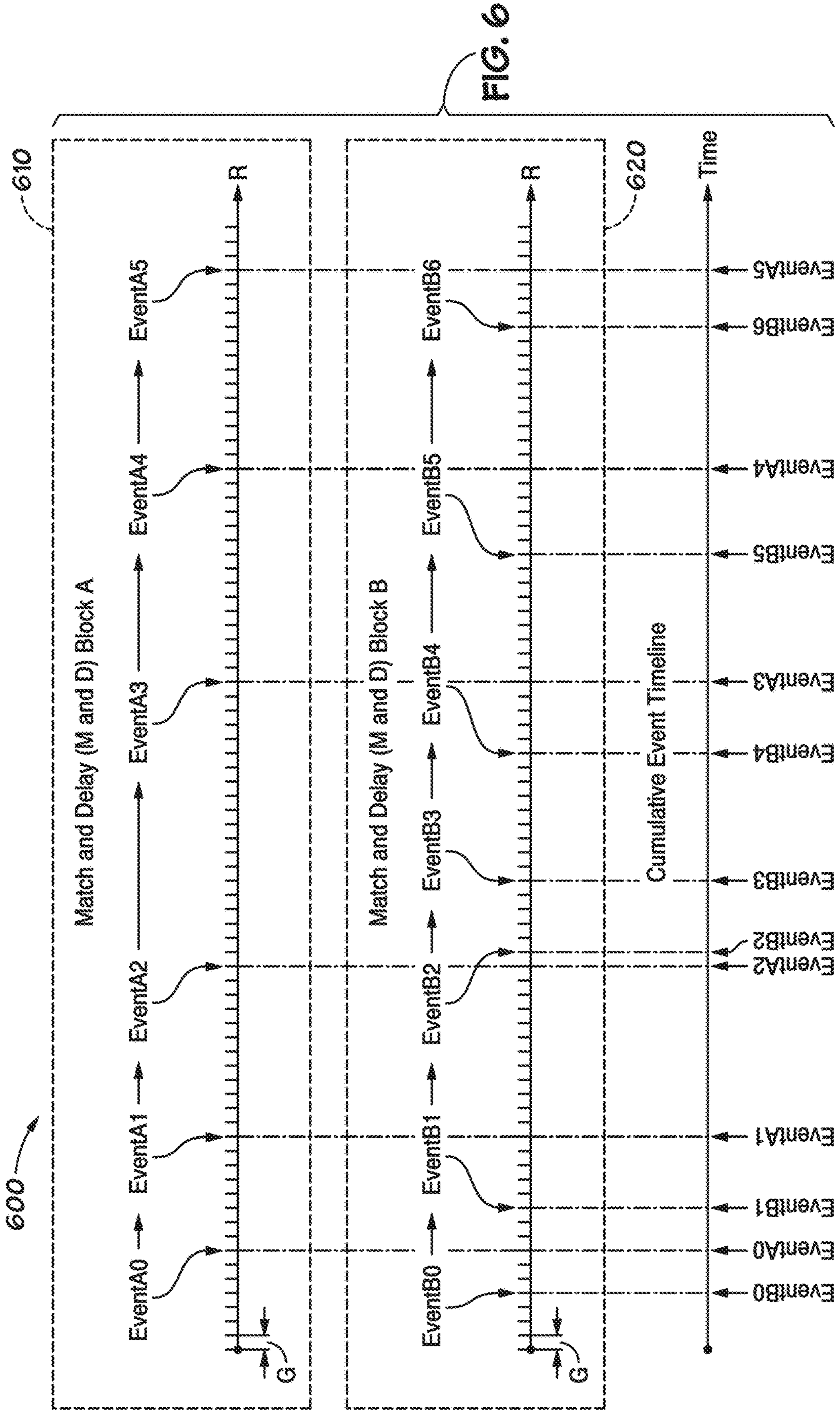
FIG. 6 is a timing diagram depicting example timing of events programmed by using the counter-based RAS chain of FIG. 3, according to an embodiment of the present disclosure.

FIG. 6 is a timing diagram 600 depicting example timing of events programmed by using the counter-based RAS chain 300. For instance, the events programmed by a Match and Delay block A of the counter-based RAS chain 300 may be illustrated in a diagram 610, and the events programmed by a Match and Delay block B of the counter-based RAS chain 300 may be illustrated in a diagram 620. The Match and Delay block A may be used to program six events (e.g., EventA0, EventA1, EventA2, EventA3, EventA4, EventA5) in a time range R, and the six events may be programmed to any time in the time range R with a timing granularity G as long as a predefined event order (e.g., EventA0→EventA1→EventA2→EventA3→EventA4→EventA5, as illustrated in diagram 610) is met. The timing granularity G may be associated with the timing granularity of the oscillator 302 (e.g., half period $$\left(\frac{CLK \text{ period}}{2}\right)$$

of the signal ClkOsc 312), time delay caused by the Gray code counter 314, etc. The Match and Delay block B may be used to program seven events (e.g., EventB0, EventB1, EventB2, EventB3, EventB4, EventB5, EventB6) in the time range R, and the seven events may be programmed to any time in the time range R with the timing granularity G as long as a predefined event order (e.g., EventB0→EventB1→EventB2→EventB3→EventB4→EventB5→EventB6, as illustrated in diagram 620) is met.

The Match and Delay block A and the Match and Delay block B may be used to independently program events such that the events programmed by the Match and Delay block A may have any order with the events programmed by the Match and Delay block B, and the time period between an event programmed by the Match and Delay block A and an event programmed by the Match and Delay block B may have any value in the time range R. Accordingly, two events may be programmed to have a timing granularity less than G by using two Match and Delay blocks. For example, EventA2 and Event B2 may be separated by a time period less than the timing granularity G since they are programmed independently by using the Match and Delay block A and the Match and Delay block B. Accordingly, fine timing granularity separation of events less than the granularity G may be obtained by programming events using more than one Match and Delay blocks of the counter-based RAS chain 300. In addition, since the digital comparator 322 and the delay chain 334 may be used for programming more than one events (e.g., the group 330 of (n+1) event settings), the counter-based RAS chain 300 may provide improved area efficiency (AE). In some embodiments, a dynamic match circuit may be used for the digital comparator 322 to provide further area savings.

In the illustrated embodiment in FIG. 3 and FIG. 6, events in the same Match and Delay block (e.g., Match and Delay block A, Match and Delay block B) may not be reordered, and the events may be programmed by using a predefined event order (e.g., EventA0→EventA1→EventA2→EventA3→EventA4→EventA5, as illustrated in diagram 610). In some embodiments, it may be desirable to reorder events in the same Match and Delay block, as illustrated in FIG. 7.

Figure 7:
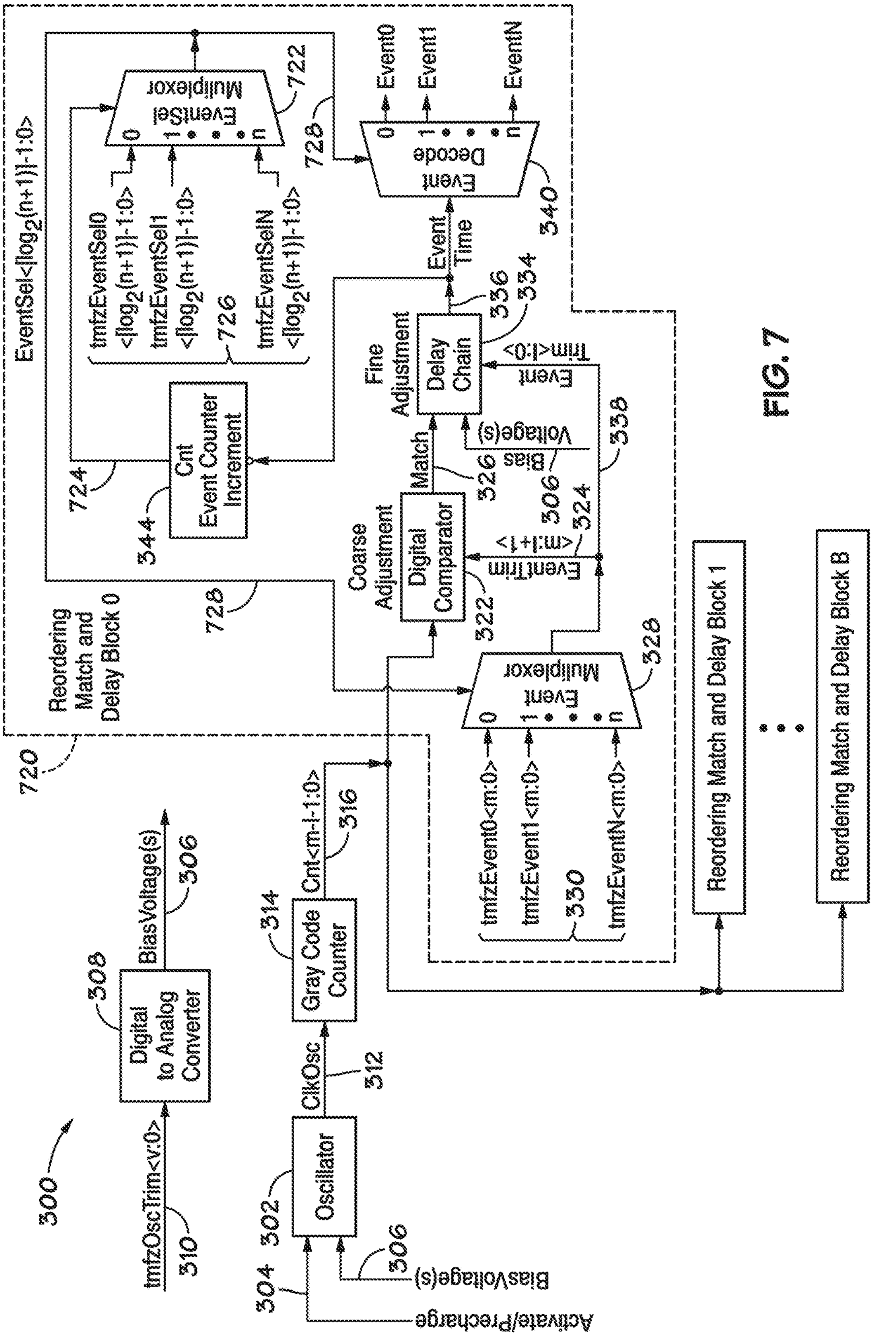
FIG. 7 is a circuit diagram of another embodiment of a Match and Delay block included in the counter-based RAS chain of FIG. 3, according to an embodiment of the present disclosure.

FIG. 7 is a circuit diagram showing another embodiment of the Match and Delay block 0 including a circuit 720, which may allow event recording in the Match and Delay block 0. For instance, the circuit 720 may include a selection device 722 (e.g., a multiplexer) to receive a select signal 724 from the event counter 344 and select an event select signal from a group 726 of (n+1) event select signals. For example, the event select signals in the group 726 may be programmed by (n+1) sets of testmode fuses (e.g., tmfzEventSelN<$\lceil \log_2(n+1)\rceil$−1:0>, N=0, 1, 2 . . . n). The selection device 722 may selectively output an event select signal from the group 726 based on the select signal 724 and use it as an event select signal 728 for the selection device 328 and the decode circuit 340. As illustrated in FIG. 7, the event time pulse 336 (e.g., the falling edge of the event time pulse 336) may be used to increment the event counter 344 to generate the select signal 724, which may be used by the selection device 722 to select the event select signal 728 from the group 726 of (n+1) event select signals. The event select signal 728 may be used by the selection device 328 to select an event setting from a group 330 of (n+1) event settings (n=1, 2 . . . ), which may be used to obtain the coarse event value 324 for the digital comparator 322. The digital comparator may then obtain the match signal 326 when the count value of the output 316 matches (e.g., equal to) the coarse event value 324. The event select signal 728 may be used by the decode circuit 340 to associate (e.g., via mapping) the event time pulse 336 with corresponding event (e.g., eventN, N=0, 1, 2 . . . n). Accordingly, in the illustrated embodiment in FIG. 7, events in the Match and Delay block 0 may be reordered by altering the sequence of tmfzEventSel values.

In some embodiments, some events may not use a fine adjustment for the delay, and fine adjustment of the event time may not be used in corresponding Match and Delay blocks. Accordingly, the configurable delay chain 334 and the fine event value 338 may not be included in some Match and Delay blocks, which may provide area savings. For example, in these embodiments, the testmode fuse terms may be used to generate the coarse event value 324, and the time pulse in the match signal 326 becomes the event time pulse 336. In some embodiments, testmode fuses may not be used to program the event settings, which may provide further area savings.

The counter-based RAS chain 300 may include any number of Match and Delay blocks, which may include any combination of circuits, having the same configurations or different configurations (e.g., the circuit 320, the circuit 720, with or without the configurable delay chain 334 and the fine event value 338). For example, in some embodiments, the Match and Delay blocks of the counter-based RAS chain 300 may use the configuration of the circuit 320; in some embodiments, the Match and Delay blocks of the counter-based RAS chain 300 may use the configuration of the circuit 720; and in some embodiments, some of the Match and Delay blocks of the counter-based RAS chain 300 may use the configuration of the circuit 320 while other Match and Delay blocks may use the configuration of the circuit 720. In addition, in some embodiments, some Match and Delay blocks may include fine adjustment (e.g., the configurable delay chain 334 and the fine event value 338), and some Match and Delay blocks may not include fine adjustment (e.g., the configurable delay chain 334 and the fine event value 338).

Figure 8:
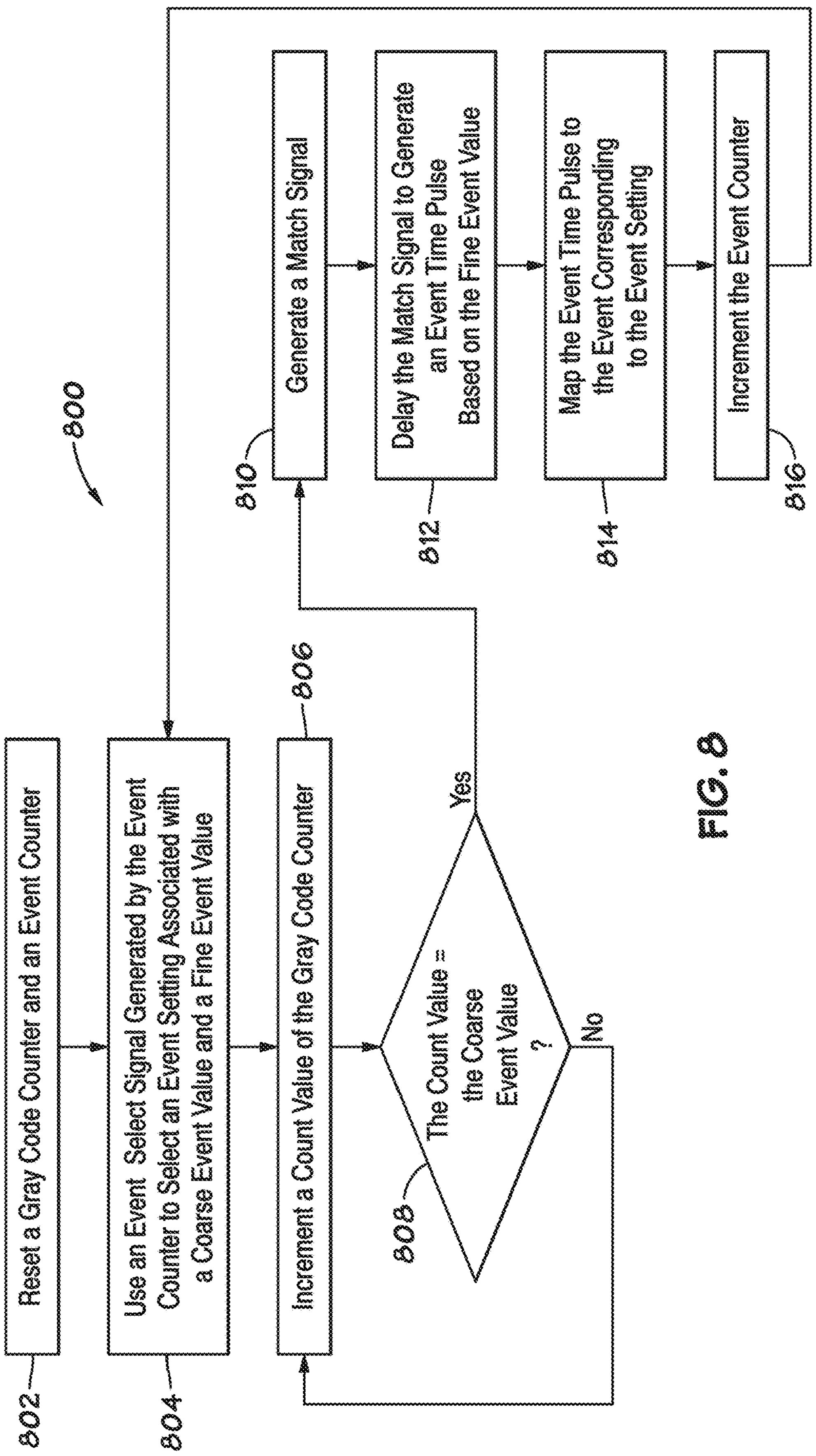
FIG. 8 is a flow diagram of a method for using a counter-based RAS chain to generate timing control signals for the memory device of FIG. 1, according to an embodiment of the present disclosure.

FIG. 8 illustrates a flow diagram of a method 800 for using a counter-based RAS chain (e.g., the counter-based RAS chain 300) to generate timing control signals for the memory device 100. At block 802, the Gray code counter 314 and the event counter 344 may be reset so that the count values of the Gray code counter 314 and the event counter 344 may be reset to zero. At block 804, the selection device 328 may select an event setting from a group 330 of (n+1) event settings (n=1, 2 . . . ) based on an event select signal (e.g., the event select signal 332 or the event select signal 728) generated by using the event counter 344. The event settings in the group 330 may be programmed by (n+1) sets of testmode fuses (e.g., tmfzEventN<m:0>, N=0, 1, 2 . . . n), and each event setting may have (m+1) (m=0, 1, 2 . . . ) testmode fuse terms. The upper testmode fuse terms (e.g., EventTrim<m:1+1>, 1=0, 1, 2 . . . m=1) of the event setting may be used to generate the coarse event value 324, and the lower testmode fuse terms (e.g., EventTrim<1:0>, 1=0, 1, 2 . . . m−1) may be used to generate the fine event value 338. At block 806, the Gray code counter 314 is incremented (e.g., by the Oscillator 302). At block 808, the count value of the Gray code counter 314 may be compared by the digital comparator 322 with the coarse event value 324. When the count value of the Gray code counter 314 is less than the coarse event value 324, the block 806 is repeated so that Gray code counter 314 may be incremented to increase the count value. When the count value of the Gray code counter 314 is equal to the coarse event value 324, the digital comparator 322 may generate the match signal 326 at block 810. At block 812, the match signal 326 may be delayed by the delay chain 334 based on the fine event value 338, and the event time pulse 336 may be generated based on the delayed match signal 326. At block 814, the decode circuit 340 may associate (e.g., via mapping) the event time pulse 336 with corresponding event (e.g., eventN, N=0, 1, 2 . . . n) based on the event select signal (e.g., the event select signal 332 or the event select signal 728) generated by using the event counter 344. At block 816, the event time pulse 336 may be used to increment the event counter 344.

Accordingly, the technical effects of the present disclosure include a method and a system related to generating timing control signals for controlling the access to the memory cells of a memory device. The memory device may employ a counter-based RAS chain circuit including multiple Match and Delay blocks to generate timing control signals with fine timing granularities. The Match and Delay blocks may include circuits to enable area savings and improve area efficiency (AE) in the memory device as well as improve the flexibility for development chips and production parts.

In the illustrated embodiments above, the memory devices and systems are primarily described in the context of devices incorporating DRAM storage media. Memory devices configured in accordance with other embodiments of the present technology, however, may include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A circuit configured to generate an event timing signal, the circuit comprising:
- an event counter configured to generate an event select signal;
- a selection device configured to select an event setting from a plurality of event settings based on the event select signal, wherein the event setting is associated with a coarse event value corresponding to a coarse adjustment of the event timing signal; and
- a decode circuit configured to map the event timing signal to an event based on the event select signal.

2. The circuit of claim 1, further comprising:
- a digital comparator configured to generate a match signal based on the coarse event value; and
- a delay chain configured to generate the event timing signal based on the match signal and a fine event value, wherein the fine event value is associate with the event setting and corresponds to a fine adjustment of the event timing signal.

3. The circuit of claim 2, wherein the digital comparator comprises a dynamic match circuit.

4. The circuit of claim 2, wherein a digital to analog converter is used to generate a bias voltage for trimming the delay chain.

5. The circuit of claim 2, wherein the plurality of event settings is programmed by a plurality of testmode fuses.

6. The circuit of claim 5, wherein each event setting of the plurality of event settings comprises a respective set of testmode fuse terms, and wherein a first subset of the respective set of testmode fuse terms is associated with the coarse event value and a second subset of the respective set of testmode fuse terms is associated with the fine event value.

7. The circuit of claim 1, wherein the event timing signal is used to increment the event counter.

8. The circuit of claim 1, further comprising another selection device configured to select the event select signal from a plurality of event select signals based on a select signal generated by the event counter.

9. The circuit of claim 8, wherein the plurality of event select signals is programmed by a set of testmode fuses.

10. A method, comprising:
- receiving an event select signal;
- selecting an event setting from a plurality of event settings based on the event select signal, wherein the event setting is associated with a coarse event value corresponding to a coarse adjustment of an event timing signal; and
- mapping the event timing signal to an event based on the event select signal.

11. The method of claim 10, further comprising:
- generating a match signal by a digital comparator based on the coarse event value; and
- generating the event timing signal by a delay chain based on the match signal and a fine event value, wherein the fine event value is associate with the event setting and corresponds to a fine adjustment of the event timing signal.

12. The method of claim 11, comprising:
- generating a bias voltage for trimming the delay chain.

13. The method of claim 11, wherein the plurality of event settings is programmed by a plurality of testmode fuses.

14. The method of claim 13, wherein each event setting of the plurality of event settings comprises a respective set of testmode fuse terms, and wherein a first subset of the respective set of testmode fuse terms is associated with the coarse event value and a second subset of the respective set of testmode fuse terms is associated with the fine event value.

15. The method of claim 10, further comprising:
- selecting the event select signal from a plurality of event select signals based on a select signal generated by an event counter, wherein the event counter is incremented by the event timing signal.

16. An apparatus, comprising:
- a first circuit configured to generate a first event timing signal based on a signal from a counter, the first circuit comprising:
  - a first event counter configured to generate a first event select signal;
  - a first selection device configured to select a first event setting from a plurality of first event settings based on the first event select signal, wherein the first event setting is associated with a first coarse event value corresponding to a first coarse adjustment of the first event timing signal; and a first decode circuit configured to map the first event timing signal to a first event based on the first event select signal; and a second circuit configured to generate a second event timing signal based on the signal from the counter, the second circuit comprising:

a second event counter configured to generate a second event select signal;

a second selection device configured to select a second event setting from a plurality of second event settings based on the second event select signal, wherein the second event setting is associated with a second coarse event value corresponding to a second coarse adjustment of the second event timing signal; and a second decode circuit configured to map the second event timing signal to a second event based on the second event select signal.

17. The apparatus of claim 16, wherein the first event timing signal and the second event timing signal are generated independently.

18. The apparatus of claim 16, wherein a timing difference between the first event timing signal the second event timing signal is less than a predefined value.

19. The apparatus of claim 18, wherein the predefined value is associated with a timing granularity of the counter.

20. The apparatus of claim 16, wherein the first plurality of event settings is programmed by a plurality of testmode fuses, and wherein each first event setting of the plurality of first event settings comprises a respective set of testmode fuse terms, and wherein a first subset of the respective set of testmode fuse terms is associated with the first coarse event value and a second subset of the respective set of testmode fuse terms is associated with a first fine event value corresponding to a first fine adjustment of the first event timing signal.

* * * * *